United States Patent
Lin

(10) Patent No.: US 7,405,972 B1
(45) Date of Patent: Jul. 29, 2008

(54) NON-VOLATILE MEMORY ARRAY

(75) Inventor: Yen-Tai Lin, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 54 days.

(21) Appl. No.: 11/625,444

(22) Filed: Jan. 22, 2007

(51) Int. Cl.
*G11C 11/34* (2006.01)
*G11C 16/04* (2006.01)

(52) U.S. Cl. .............................. 365/185.05; 365/185.18

(58) Field of Classification Search .................. 365/185
See application file for complete search history.

(56) References Cited

U.S. PATENT DOCUMENTS

| | | | |
|---|---|---|---|
| 6,744,675 B1 | 6/2004 | Zheng et al. | |
| 6,801,456 B1 | 10/2004 | Hsu et al. | |
| 6,937,514 B2 * | 8/2005 | Hasegawa | 365/185.12 |
| 7,050,344 B1 * | 5/2006 | Cho et al. | 365/201 |

FOREIGN PATENT DOCUMENTS

JP      2004-179626      6/2004

* cited by examiner

*Primary Examiner*—Huan Hoang
*Assistant Examiner*—Michael J Weinberg
(74) *Attorney, Agent, or Firm*—J.C. Patents

(57) ABSTRACT

A non-volatile memory array including a plurality of memory units is provided. Each memory unit is serially connected with a select transistor and a memory cell. A source region is next to the select transistor while a drain region is next to the memory cell. The drain lines are arranged in parallel in column direction and connected with the drain regions of the memory units in one column. The bit lines are arranged in parallel in row direction and connected with the source regions of the memory units in one row. The word lines are arranged in parallel in column direction and connected with the select gates of the memory units in one column. The control lines are arranged in parallel in column direction and connected with the control gates of the memory units in one column. The control lines are grouped by two and electrically connected with each other.

23 Claims, 4 Drawing Sheets

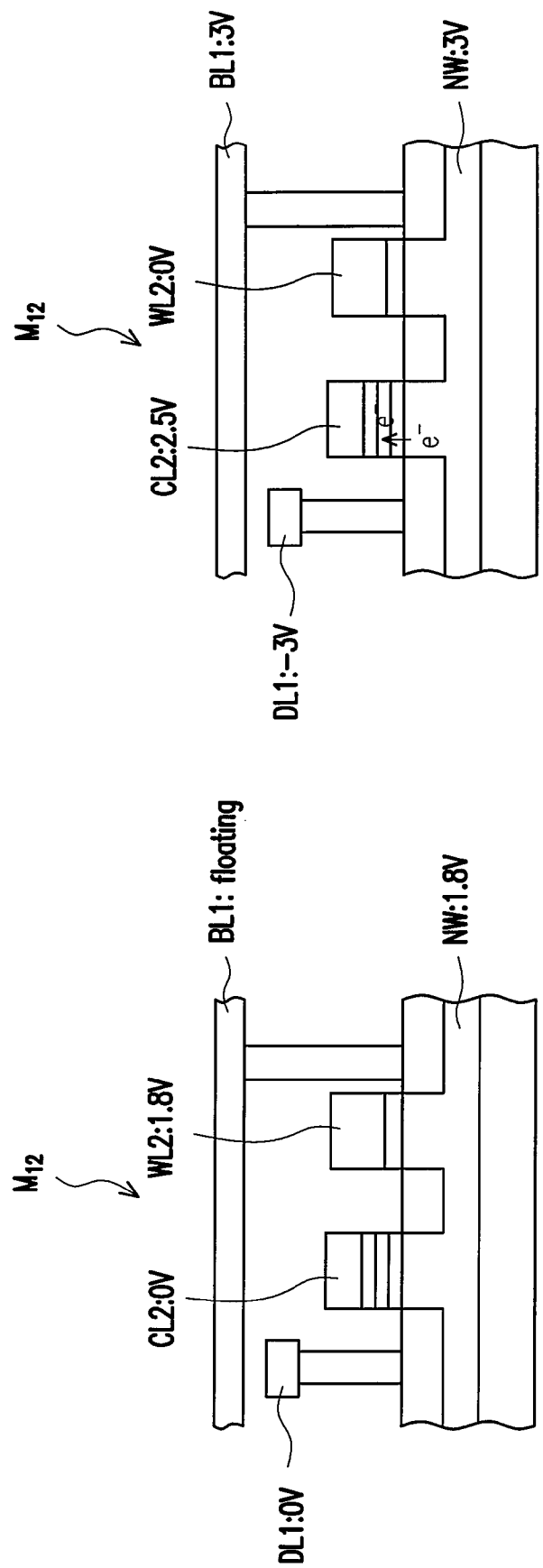

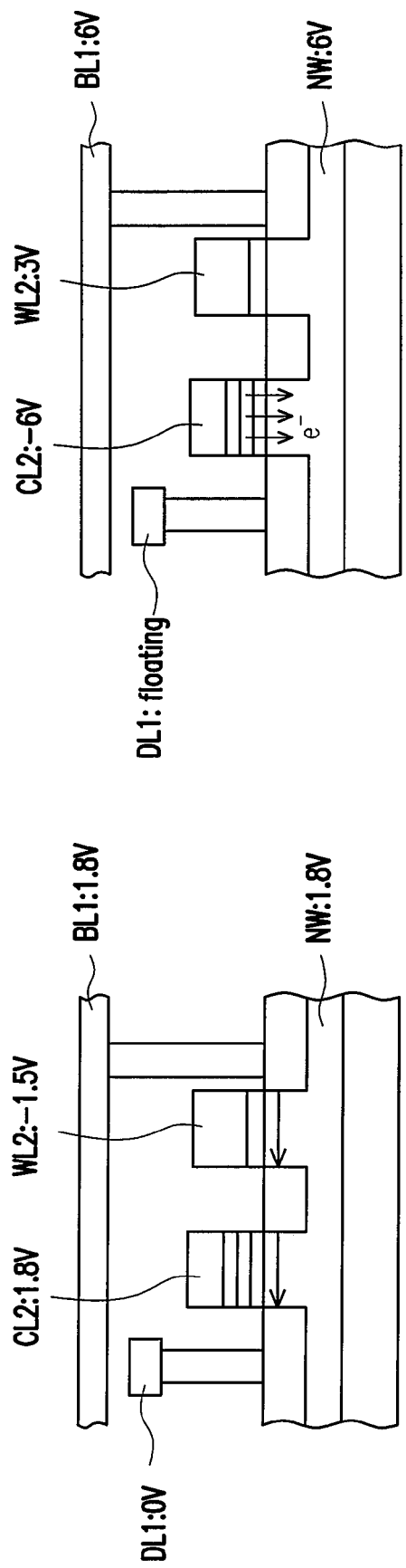

NON-VOLATILE MEMORY ARRAY

BACKGROUND OF THE INVENTION

1. Field of the Invention

The present invention relates to a semiconductor device. More particularly, the present invention relates to a non-volatile memory array.

2. Description of Related Art

Electrically erasable programmable read only memory (EEPROM) is one type of non-volatile memory that allows multiple data writing, reading and erasing operations. Furthermore, the stored data will be retained even after power to the device is removed. With these advantages, EEPROM has been broadly applied in personal computer and electronic equipment.

A conventional EEPROM has a floating gate and a control gate, which are manufactured by doped polysilicon. Such non-volatile memory is having a double layer gate which is hard to integrate with general CMOS Logic Process. Furthermore, the fabricating cost of the whole embedded non-volatile memory increases due to the double layer gate which is unfavorable in competition at an advantageous position.

In addition, when programming the memory, the electrons are injected into the floating gate and uniformly distributed in the whole polysilicon floating gate layer. However, if the tunneling oxide layer under the polysilicon floating gate layer has defects, it can easily cause a leakage current of the device, affecting the reliability of the device.

In order to solve the problem of the leakage current of the EEPROM device, a charge trapping material is adopted to replace the polysilicon. Such charge trapping material is silicon nitride, for example. Since the silicon nitride has capable of trapping electrons, the electrons injected into the silicon nitride layer just concentrate in local region, it is not so sensitive to the defects of the tunneling oxide layer, and thus lessening the leakage current of the device. The silicon nitride layer usually has a silicon oxide layer on its top surface and bottom surface respectively, thus forming an oxide-nitride-oxide (ONO) composite layer.

On the other hand, in order to prevent the problem of data error due to over-erase/write phenomenon when the typical EEPROM erases/writes, a select transistor serially connected at one side of the memory cells to form the two transistors (2T) structure. The programming and reading of the memory cells can be controlled by the select transistor.

A memory unit of the aforementioned 2T structure is serially connected by a select transistor and a memory cell. A bit line is connected next to the memory cell and a source line is connected next to the select transistor. While operating the non-volatile memory array having the 2T structure, the unselected memory unit connected with the selected bit line of the selected memory unit might have the situation of program disturb or erase disturb which cause the memory unit to be mistakenly written or erased. For example, when performing programming operation by channel hot carrier injection, a high voltage is applied to the bit line of the selected memory unit because the bit lines in the same row are connected together; namely, all memory units in the same row effect by the program disturb. When performing erasing operation by Fowler-Nordheim (FN) tunneling effect, a high voltage is applied to the bit line of the selected memory unit because the bit lines in the same row are connected together. One high voltage is cross between the control line and the bit line and cause all memory units to generate the soft erasure and to lower the reliability of the memory unit.

SUMMARY OF THE INVENTION

The present invention is directed to a non-volatile memory array to reduce the phenomenon of program disturb and erase disturb as well as improve the reliability of the memory unit.

The present invention provides a non-volatile memory array including a plurality of memory units, a plurality of drain lines, a plurality of bit lines, a plurality of word lines and a plurality of control lines. A plurality of memory units are arranged in a row/column array. Each memory unit includes a first conductive type well, a second conductive type drain region, a second conductive type doped region, a second conductive type source region, a select gate, a control gate and a charge storage structure. The first conductive type well is disposed within the substrate. The second conductive type drain region, the second conductive type doped region and the second conductive type source region are disposed within the first conductive type well. The select gate is disposed on the substrate between the second conductive type source region and the second conductive type doped region. The control gate is disposed on the substrate between the second conductive type doped region and the second conductive type drain region. The charge storage structure includes at least a charge storage layer which is disposed between the control gate and the substrate, wherein the neighboring two memory units in the same row are disposed in a mirror symmetry manner. A plurality of drain lines are arranged in parallel in column direction and connected with the second conductive type drain regions of the memory units in one column. A plurality of bit lines are arranged in parallel in row direction and connected with the second conductive type source regions of the memory units in one row. A plurality of word lines are arranged in parallel in column direction and connected with the select gates of the memory units in one column. A plurality of control lines are arranged in parallel in column direction and connected with the control gates of the memory units in one column, in which every two control lines are electrically connected. The memory units in two columns of the electrically connected control lines compose a page; meanwhile, the two neighboring memory units in the same page in row direction commonly share the second conductive type drain region.

In the aforementioned non-volatile memory array, the first conductive type is N type and the second conductive type is P type.

The aforementioned non-volatile memory array further includes a select gate dielectric layer which is disposed between the select gate and the substrate. The material of select gate dielectric layer includes oxide/nitride/oxide layer.

In the aforementioned non-volatile memory array, the charge storage structure further includes tunneling dielectric layer which is disposed between the charge storage layer and the substrate. The material of the tunneling dielectric layer includes silicon oxide.

In the aforementioned non-volatile memory array, the charge storage structure further includes inter-gate dielectric layer which is disposed between the charge storage layer and the control gate. The material of the inter-gate dielectric layer includes silicon oxide.

In the aforementioned non-volatile memory array, the charge storage layer includes a silicon nitride layer, a silicon oxynitride layer, a nano-crystal layer or a doped polysilicon layer.

In the aforementioned non-volatile memory array, the two neighboring memory units in the same page in row direction commonly share the second conductive type drain region.

The non-volatile memory array in the present invention has grouped the control lines by two so as to compose a plurality of pages. Therefore, it can prevent the neighboring memory units from programming, erasing or reading disturb mutually when operating.

Moreover, the bit lines are disposed on one side of the select transistor; namely, the select transistor is between the bit lines and the memory cells. When the erasing operation is performed to the memory array, the channel of the select transistors of the other unselected memory units that commonly shared the selected bit lines are at the closed state, the voltage applied to the selected bit lines cannot turn-on to the memory cells of the other unselected memory units; therefore, it can prevent the other unselected memory units that commonly shared the selected bit lines from the erasing disturb. Furthermore, as each page does not commonly share the drain lines, it is able to perform the erasing operation in one page as a unit.

The present invention also provides a method for operating a non-volatile memory which is suitable for the non-volatile memory array. The non-volatile memory array includes a plurality of memory units, a plurality of drain lines, a plurality of bit lines, a plurality of word lines and a plurality of control lines. Each memory unit includes an N type well region disposed in the substrate; a P type drain region, a P type doped region and a P type source region disposed in the N type well region; a select gate disposed on the substrate between the P type source region and the P type doped region; a control gate disposed on the substrate between the P type doped region and the P type drain region; and a charge storage layer disposed between the control gate and the substrate, wherein the two neighboring units in the same row are disposed in a mirror symmetry manner. The drain lines are arranged in parallel in column direction and connected with the P type drain region of each memory unit in one column. The bit lines arranged in parallel in row direction and connected with the P type source region of each memory unit in one row. The word lines are arranged in parallel in column direction and connected with the select gate of each memory unit in one column. The control lines arranged in parallel in column direction and connected with the control gate of each memory unit in one column. Wherein every two control lines are connected together electrically and the two-column memory units thereof compose one page as well as the two neighboring memory units in one page in the row direction commonly share the P type drain region. The method of operating the non-volatile memory includes following steps. A first voltage is applied to all of the word lines, a second voltage is applied to all of the control lines, all of the bit lines is floating, a third voltage is applied to all of the drain lines, and a fourth voltage is applied to the N type well region to lie the non-volatile memory array in the standby state.

In the aforementioned method of operating the non-volatile memory, the first voltage is about 1.8V, the second voltage is about 0V, the third voltage is about 0V, and the fourth voltage is about 1.8V.

In the aforementioned method of operating the non-volatile memory, when the programming operation is performed to the non-volatile memory, a fifth voltage is applied to the selected word lines connected with the selected memory unit in the selected page, a sixth voltage is applied to the selected control line connected with the selected memory unit, a seven voltage is applied to the selected bit lines connected with the selected memory unit, a eighth voltage is applied to the selected drain lines connected with the selected memory unit, a fourth voltage is applied to N type well region to program the selected memory unit by channel hot hole induced the channel hot electron injection, wherein the fifth voltage is sufficient to open the channel under the select gate of the selected memory unit; the seven voltage is larger than the eighth voltage, the voltage difference between the sixth voltage and seven voltage is sufficient to pull the electron from the P type drain region side of the selected memory unit into the charge storage layer.

In the aforementioned method of operating a non-volatile memory, the fifth voltage is about 0V; the sixth voltage is about 2.5 V; the seventh voltage is about 3 V, and the eighth voltage is about −3 V.

In the aforementioned method of operating a non-volatile memory, when the erasing operation is performed to the non-volatile memory, a ninth voltage is applied to the selected word lines connected with the selected memory unit in the selected page, a tenth voltage is applied to the selected control line connected with the selected memory unit, a eleventh voltage is applied to the bit line, the selected drain lines connected with the selected memory unit is floating, a twelfth voltage is applied to the N type well region. The voltage difference between the tenth voltage and eleventh voltage is sufficient to induce the FN tunneling effect and to erase all memory units in the selected page.

In the aforementioned method of operating the non-volatile memory, further includes a step of applying a thirteenth voltage to the drain line of the memory unit in the other unselected page.

In the aforementioned method of operating the non-volatile memory, further includes a step of applying a fourteenth voltage to the word line of the memory unit in the other unselected page, and applying a fifteenth voltage to the control line of the memory unit in the other unselected page.

In the aforementioned method of operating a non-volatile memory, the ninth voltage is about 3 V; the tenth voltage is about −6 V; the eleventh voltage is about 6 V, the twelfth voltage is about 6 V, the thirteenth voltage is larger than 0 V or thereabouts, the fourteen voltage is about 6 V and the fifteenth voltage is about −3 V.

In the aforementioned method of operating the non-volatile memory, when the reading operation is performed to the non-volatile memory, a sixteenth voltage is applied to the selected word line connected with the selected memory unit in the selected page, a seventeenth voltage is applied to the selected control line connected with the selected control line of the selected memory unit, a eighteenth voltage is applied to the selected bit line of the selected memory unit, the third voltage is applied to all of the drain lines, the fourth voltage is applied to the N type well region to read the selected memory unit, wherein the sixteenth voltage is sufficient to open the channel under the select gate of the selected memory unit, and the eighteenth voltage is larger than that third voltage.

In the aforementioned method of operating a non-volatile memory, the sixteenth voltage is about −1.5 V; the seventeenth voltage is about 1.8 V; and the eighteenth voltage is about 1.8 V.

The control lines in the present invention are grouped by two so as to compose a plurality of pages. Therefore, when operating the non-volatile memory array in the present invention, it can prevent the neighboring memory units from programming, erasing and reading disturb mutually. When the programming operation is preformed to the selected memory unit connected with the control line in the selected page, a bias is applied to the control line in the selected page, and a bias that will not cause the program disturb is applied to the other unselected control line group so as to prevent from causing the program disturb to the memory unit of other groups.

Furthermore; when reading operation is preformed to the memory array, only a bias is applied to the selected page to read the memory unit connected with the control line in the selected page and, consequently, the reading operation becomes simpler. Meanwhile, the kind of bias applied becomes simpler as well.

In addition, when the erasing operation is preformed to the memory array, either the bias is applied to the control line of the selected page and no bias is applied to the control line group in the other unselected page, or the bias of controlling FN tunneling effect is applied to the word line, control line or drain line in the other unselected page and to prevent from causing the soft erase phenomenon to the memory unit in the other page.

In order to make the aforementioned and other objects, features and advantages of the present invention comprehensible, a preferred embodiment accompanied with figures are described in detail below.

BRIEF DESCRIPTION OF THE DRAWINGS

FIG. 2A is a schematic view of an example of the standby state of the non-volatile memory according to the present invention.

FIG. 2B is a schematic view of an example of the programming operation of the non-volatile memory according to the present invention.

FIG. 2C is a schematic view of an embodiment of the reading operation of the non-volatile memory according to the present invention.

FIG. 2D is a schematic view showing an erasing operation of the present invention.

DESCRIPTION OF EMBODIMENTS

Figure 1A:
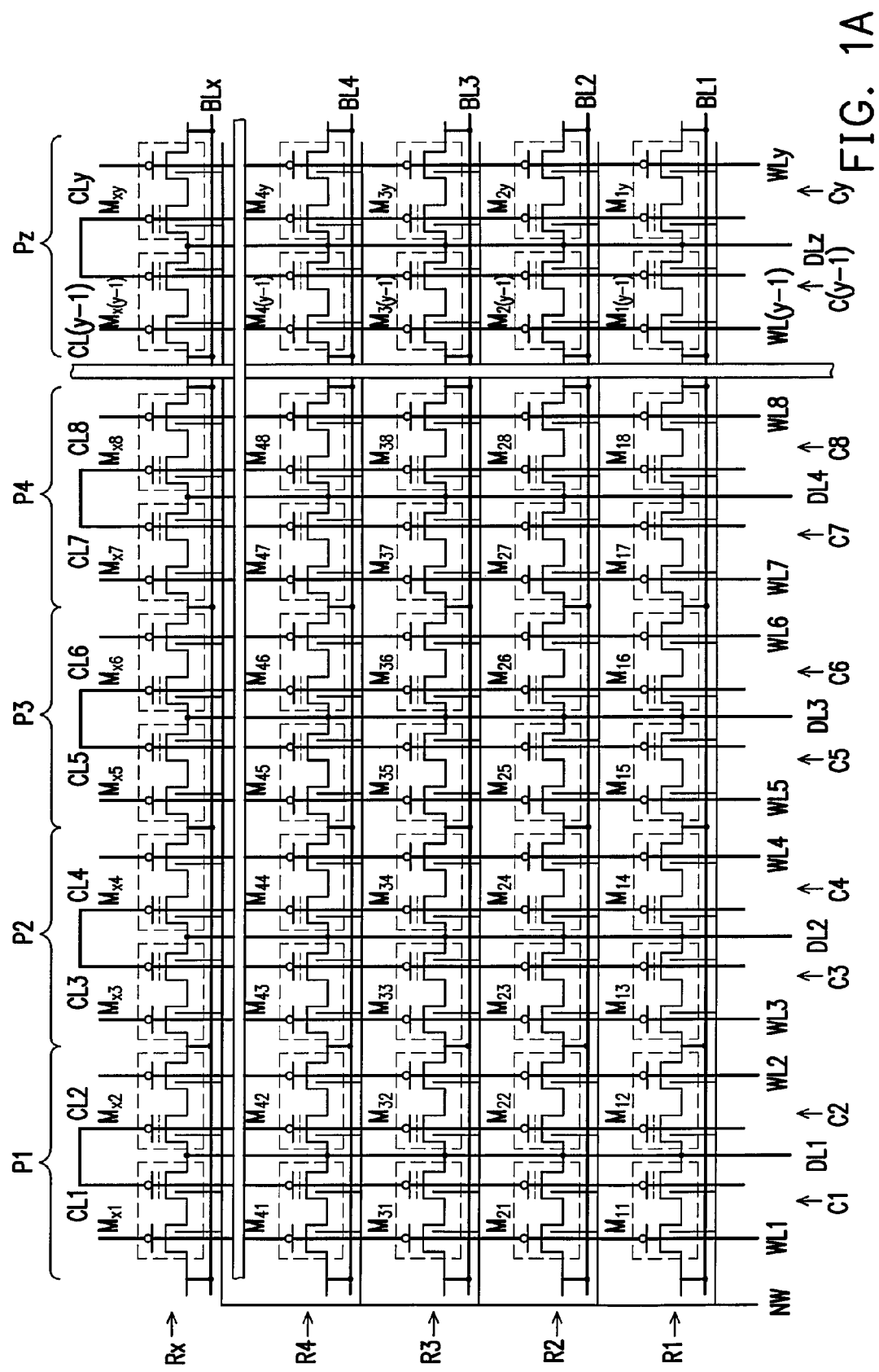
FIG. 1A shows a schematic diagram of a circuit of a non-volatile memory array according to a preferred embodiment of the present invention.
Figure 1B:
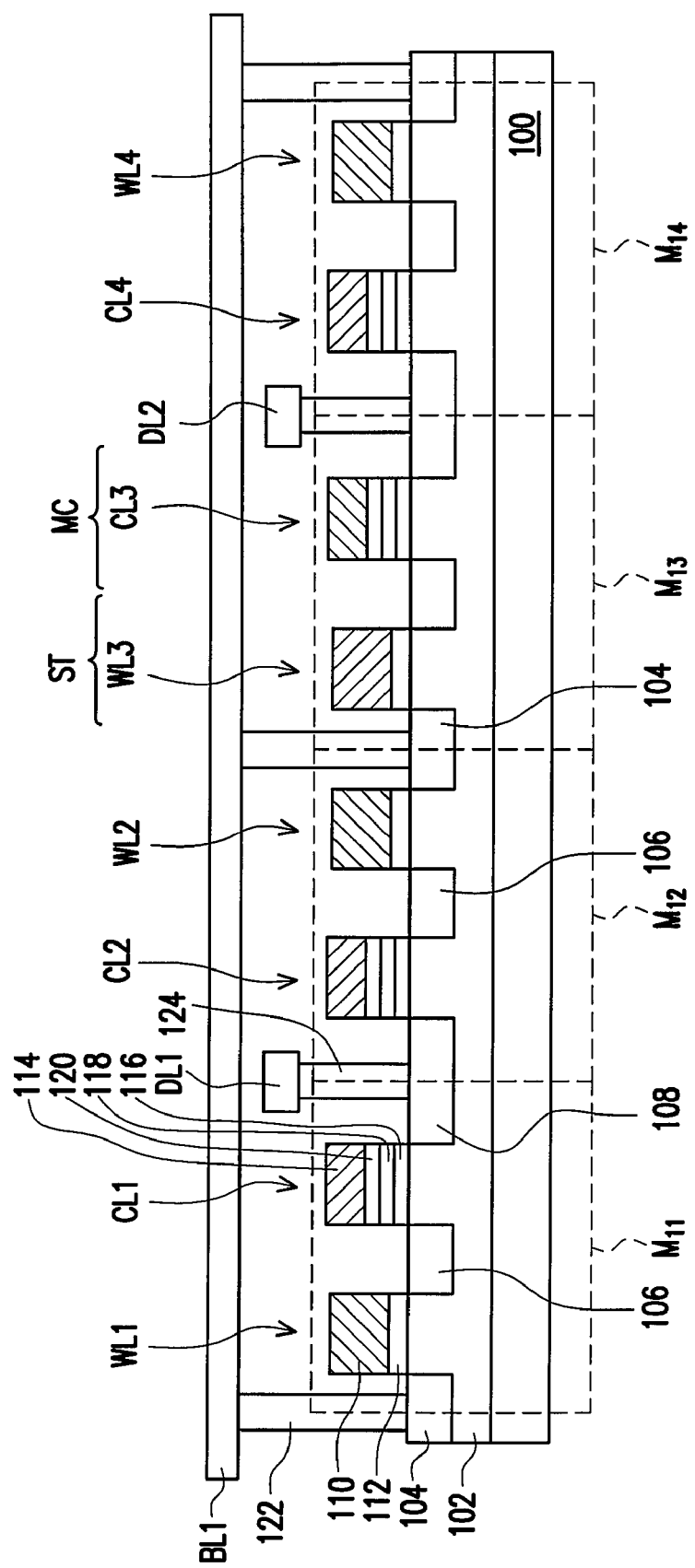
FIG. 1B is a schematic cross-sectional view of a non-volatile memory unit according to one preferred embodiment of the present invention.

FIG. 1A shows a schematic diagram of a circuit of a non-volatile memory array according to a preferred embodiment of the present invention. FIG. 1B is a schematic cross-sectional view of a non-volatile memory unit according to one preferred embodiment of the present invention. FIG. 1B is a cross-sectional view showing the memory units $M_{11}$~$M_{14}$ in FIG. 1A.

First of all, the structure of the memory units in the present invention is described. Referring to FIG. 1B, the memory units in the present invention includes a substrate 100, an N type well region 102, a P type source region 104, a P type doped region 106, a P type drain region 108, a select gate 110, a select gate dielectric layer 112, a control gate 114, a tunnel dielectric layer 116, a charge storage layer 118 and an inter-gate dielectric layer 120. Wherein, the P type source region 104, the P type doped region 106, the select gate 110, the select gate dielectric layer 112 compose a select transistor (ST). The P type doped region 106, the P type drain region 108, the control gate 114, the tunnel dielectric layer 116, the charge storage layer 118 and the inter-gate dielectric layer 120 compose a memory cell (MC). The memory units of the present invention are serially connected with a select transistor (ST) and a memory cell (MC).

The substrate 100 is made of, for example, a silicon substrate. The N type well 102 is, for example, disposed in the substrate 100.

The P type source region 104, the P type doped region 106 and the P type drain region 108 is, for example, disposed in the substrate 100.

The select gate 110 is disposed, for example, between the P type source region 104 and P type doped region 106. The material of select gate 110 is, for example, doped polysilicon. The select gate dielectric layer 112 is disposed between the select gate 110 and the substrate 100, for example. The select gate dielectric layer 112 is fabricated using silicon oxide, for example.

The control gate 114 is disposed between the P type doped region 106 and the P type drain region 108. The control gate 114 is made of, for example, doped polysilicon. The control gate 114 and the select gate 110 are fabricated by the same gate process steps so as to lower the fabricating cost.

The charge storage structure from the bottom to the top includes the tunneling dielectric layer 116, the charge storage layer 118 and inter-gate dielectric layer 120. The charge storage layer 118 is disposed between the control gate 114 and the substrate 100, for example. The charge storage layer 118 is made of, for example, the conductive material (such as doped polysilicon) or the charge trapping material (such as silicon nitride, silicon oxynitride ($Si_xO_yN_z$), and nano-crystal).

The tunneling dielectric layer 116 is disposed, for example, between the charge storage layer 118 and the substrate 100. The tunneling dielectric layer is made of a silicon oxide layer, for example.

The inter-gate dielectric layer 120 is disposed, for example, between the charge storage layer 118 and the control gate 114. The inter-gate dielectric layer 120 is fabricated using silicon oxide, for example.

The P type source region 104, for example, is connected to the bit line BL1 by a plug 122. The P type drain region 108 is electrically connected to the corresponding drain lines DL1~DL2 by a plug 124, respectively.

The structure of the non-volatile memory array of the present invention is illustrated below. Referring to FIG. 1A, the non-volatile memory array of the present invention includes a plurality of memory units $M_{11}$~$M_{xy}$, a plurality of word lines WL1~$WL_y$, a plurality of control lines CL1~CLy, a plurality of bit lines BL1~BLx, a plurality of drain lines DL1~DLz and the N type well region NW.

The memory units $M_{11}$~$M_{xy}$ are arranged in one row/column array. In the row direction, the memory units $M_{11}$, $M_{12}$, ..., $M_{1y}$ are serially connected to form the memory units row R1; the memory units $M_{21}$, $M_{22}$, ..., $M_{2y}$ are serially connected to form the memory units row R2; similarly, the memory units $M_{x1}$, $M_{x2}$, ..., $M_{xy}$ are serially connected to form the memory units row Rx.

In the column direction, the memory units $M_{11}$, $M_{21}$, ..., $M_{xy}$ are serially connected to form the memory units column C1; the memory units $M_{12}$, $M_{22}$, ..., $M_{x2}$ are serially connected to form the memory units column C2; similarly, the memory units $M_{1y}$, $M_{2y}$, ..., $M_{xy}$ are serially connected to form the memory units column Cy.

In each memory unit row R1~Rx, the two neighboring memory units are disposed in a mirror symmetry manner, and the two neighboring memory units commonly share the drain region or the source region. For example, in the memory unit row R1, memory unit $M_{11}$ and $M_{12}$ are disposed in a mirror symmetry manner as well as use the drain region mutually; the memory unit $M_{12}$ and $M_{13}$ are disposed in a mirror symmetry manner as well as use the source region mutually; similarly, the memory units $M_{1(y-1)}$ and $M_{1y}$ are disposed in a mirror symmetry manner as well as use the drain region mutually.

The N type well region NW is disposed in the substrate under the memory units $M_{11}$~$M_{xy}$.

The bit lines BL1~BLx, for example, are arranged in parallel in the row direction and connected with the source region of each memory unit in one row. For example, the bit line BL1 is connected with the source region of memory units $M_{11}$ $M_{1y}$, in the memory unit row R1; the bit line BL2 is connected with the source region of the memory units $M_{21}$~$M_{2y}$, in the memory unit row R2; similarly, the bit line BLx is connected with the source region of memory units $M_{x1}$~$M_{xy}$, in the memory row Rx.

The drain lines DL1~DLz are arranged in parallel in the column direction and connected with the drain region of each memory unit in one column, for example. Meanwhile, every two neighboring memory cells will commonly share one drain line. For example, the drain line DL1 is connected with the drain region of the memory units $M_{11}$~$M_{x1}$ in the memory unit column C1 and the drain region of the memory units $M_{12}$~$M_{x2}$ in the memory column C2. The drain line DL2 is connected with the drain region of the memory units $M_{13}$~$M_{x3}$ in the memory unit column C3 and the drain region of the memory units $M_{14}$~$M_{x4}$ in the memory unit column C4; similarly, the drain line DLz is connected with the drain region of memory units $M_{1(y-1)}$~$M_{x(y-1)}$ in the memory unit column C(y-1) and the drain region of the memory units $M_{1y}$~$M_{xy}$ in the memory column Cy.

A plurality of word lines WL1~WLy are arranged in parallel in the column direction and connected with the select gate of each memory unit in one column. For example, the word line WL1 is connected with the select gate of memory units $M_{11}$~$M_{x1}$ in the memory unit column C1; the word line WL2 is connected with the select gate of the memory units $M_{12}$~$M_{x2}$ in the memory unit column C2; similarly, the word line WLy is connected with the select gate of the memory units $M_{1y}$~$M_{xy}$ in the memory unit column Cy.

A plurality of control lines CL1~CLy are arranged in parallel in the column direction and connected with the control gate of each memory unit in one column. For example, the control line CL1 is connected with the control gate of memory units $M_{11}$~$M_{x1}$ in the memory unit column C1; the control line CL2 is connected with the control gate of the memory units $M_{12}$~$M_{x2}$ in the memory unit column C2; similarly, the control line CLy is connected with the control gate of the memory units $M_{1y}$~$M_{xy}$ in the memory unit column Cy. The control lines CL1~LCy are grouped by two and electrically connected together. For example, the control line CL1 is electrically connected with the control line CL2; the control line CL3 is electrically connected with the control line CL4; similarly, the control line CL(y-1) is electrically connected with the control line CLy. Furthermore, the control lines CL1~CLy are connected with the two columns memory units column C1~Cy so as to compose the page P1~Pz, respectively. That is to say, the memory unit columns C1 and C2 compose page $P_1$; the memory unit columns C3 and C4 compose page P2; similarly, the memory unit column C(y-1) and Cy compose page Pz.

The control lines in the present invention are grouped by two so as to compose a plurality of pages P1~Pz. Therefore, when operating the non-volatile memory array in the present invention, it can prevent the neighboring memory units from programming, erasing and reading disturb mutually.

Moreover, the bit lines B11~BLx are disposed on one side of the select transistor; namely, the select transistor is between the bit lines and the memory cells. When the erasing operation is preformed to the memory array, the channel of the select transistor of the other unselected memory unit that commonly shared the selected bit line is at the closed state, the voltage applied to the selected bit lines cannot conduct to the memory cells of the other unselected memory units; therefore, it can prevent the other unselected memory units that commonly shared the selected bit lines from the erasing disturb. Furthermore, as each page does not commonly share the drain lines, it is able to use one page as a unit to perform the erasing operation.

Referring to FIG. 1A and FIG. 2A~2D for the following illustration of the method of operating the non-volatile memory in the present invention. FIG. 2A is a schematic view of an example of the standby state of the non-volatile memory according to the present invention. FIG. 2B is a schematic view of an example of the programming operation of the non-volatile memory according to the present invention. FIG. 2C is a schematic view of an embodiment of the reading operation of the non-volatile memory according to the present invention. FIG. 2D is a schematic view showing an erasing operation of the present invention.

The operation of the non-volatile memory of the present invention described herein is only a preferred embodiment is not intended in any way to limit the scope of the present invention. However, the method of operating the non-volatile memory is not limited as such. The following description uses the memory cell $M_{12}$ as an example.

As shown in FIG. 1A and 2B, the voltage Vs1, for example, about 1.8 V, is applied to all of the word lines WL1~WLy. The voltage Vs2, for example, about 0 V, is applied to all of the control lines CL1~CLy. All of the bit lines BL1~BLx are floating. The voltage Vs3, for example, about 0 V, is applied to all of the drain lines DL1~DLz. The voltage Vs4, for example, about 1.8 V, is applied to the N type well region NW so that the whole non-volatile memory array is in the standby state.

As shown in FIGS. 1A and 2B, the following illustration is taken the programming operation to store electrons into the charge storage layer of the memory unit $M_{12}$ as an example. In the programming operation, the voltage Vp1, for example, about 0 V, is applied to the selected word line: WL2 which connects with the selected memory unit $M_{12}$ in the selected page P1. The voltage Vp2, for example, about 2.5 V, is applied to the selected control line CL2 which connects with the selected memory unit $M_{12}$. The voltage Vp3, for example, about 3 V, is applied to the selected bit line BL1 which connects with the selected memory unit $M_{12}$. The voltage Vp4, for example, about -3 V, is applied to the selected drain line DL1 which connects with the selected memory unit $M_{12}$. The voltage Vs4, for example, about 3 V, is applied to the N type well region NW to program the selected memory unit $M_{12}$ by the channel hot hole induced channel hot electron injection. The voltage Vp1 is sufficient to open the channel under the select gate of the selected memory unit $M_{12}$. The voltage Vp3 is larger than that of Vp4, and the voltage difference between the Vp2 and Vp3 is sufficient to pull the electron from the P type drain region side of the selected memory unit $M_{12}$ into the charge storage layer.

When the above program operation is performed, the unselected memory unit $M_{11}$ in Page P1 will not be programmed, as the voltage Vdp, for example, about 3 V, is applied to WL1, the channel of select transistor of the memory unit $M_{11}$ is closed; thus, the voltage applied to the bit line BL1 cannot be turned-on to the memory cell and is not able to trigger the channel hot hole induced channel hot electron injection.

The unselected memory units $M_{21}$, $M_{31}$, ..., $M_{x1}$ in page P1 will not be programmed due to the voltage Vdp, for example, about 3 V, is applied to WL1; therefore, the channel of select transistor of the memory units $M_{21}$, $M_{31}$, ..., $M_{x1}$ is closed. Meanwhile, the bit lines connected with these memory units $M_{21}$, $M_{31}$, ..., $M_{x1}$ are all floating; thus, there is no voltage being turned-on to the memory cell and cannot trigger the channel hot hole induced channel hot electron injection.

The unselected memory units $M_{22}, M_{32}, M_{42}, \ldots, M_{x2}$ in page P1 will not be programmed due to the bit lines connected with these memory units $M_{22}, M_{32}, M_{42}, \ldots, M_{x1}$ are all floating; thus, there is no voltage being turned-on to the memory cell and cannot trigger the channel hot hole induced channel hot electron injection.

Furthermore, the unselected memory units $M_{13}, M_{14}, \ldots, M_{1y}$ in the memory unit row R1 will not be programmed due to the voltage Vdp, for example, about 3 V, is applied to WL3~WLy; consequently, the channel of select transistor of the memory units $M_{13}, M_{14}, \ldots, M_{1y}$ is closed. Meanwhile, the voltage applied to the bit line BL1 cannot be turned-on to the memory cell. Furthermore, the voltage Vs2, for example, about 0 V, is applied to the control lines CL3, CL4~CLy which cannot trigger the channel hot hole induced channel hot electron injection. Nevertheless, the other unselected memory units $M_{23}, M_{24}, \ldots, M_{xy}$ are all in the standby state and will not be programmed.

As shown in FIGS. 1A and 2C, the following illustration is taken the reading operation to the memory unit $M_{12}$ as an example. In the reading operation, the voltage Vr1, for example, about −1.5 V, is applied to the selected word line WL2 connected with the selected memory unit $M_{12}$ in the selected page P1. The voltage Vr2, for example, about 1.8 V, is applied to the selected control line CL2 connected with the selected memory unit $M_{12}$. The voltage Vr3, for example, about 1.8 V, is applied to the selected bit line connected with the selected memory unit $M_{12}$. The voltage Vs3, for example, about 0 V, is applied to all of the drain lines DL1~DLz. The voltage Vs4, for example, about 1.8 V, is applied to the N type well NW in order to read the selected memory unit $M_{12}$. The voltage Vr1 is sufficient to open the channel under that select gate of the selected memory unit $M_{12}$. The voltage Vr3 is larger than that of Vs3. When the total charge in the charge storage layer is negative, the channel of the memory cell is turned on and the current is larger, while when the total charge in the charge storage layer is slightly positive, the channel of the memory cell is turned off and the current is small. Accordingly, the state "0" or "1" of the memory unit can be determined based on the on/off status of the channel or by measuring current at the channel of the memory cell.

When the above read operation is performed, the unselected memory unit $M_{11}$ in page P1 will not be read, as the voltage Vs1, for example, about 1.8 V, is applied to WL1, the channel of select transistor of the memory unit $M_{11}$ is closed, thus, the voltage applied to the bit line BL1 cannot be turned-on to the memory cell and the aforementioned memory unit is not able to be read.

The unselected memory units $M_{21}, M_{31}, \ldots, M_{x1}$ in page P1 will not be read due to the voltage Vs1, for example, about 1.8 V, is applied to WL1; therefore, the select transistor channel of the memory units $M_{21}, M_{31}, \ldots, M_{x1}$ is closed. Meanwhile, the bit lines connected with these memory units $M_{21}, M_{31}, \ldots, M_{x1}$ are all floating; thus, there is no voltage being turned-on to the memory cell and the aforementioned memory units cannot be read.

The unselected memory units $M_{22}, M_{32}, M_{42}, \ldots, M_{x2}$ in page P1 will also not be read due to the bit lines connected with these memory units $M_{22}, M_{32}, M_{42}, \ldots, M_{x1}$ are all floating; thus, there is no voltage being turned-on to the memory cell and the aforementioned memory units cannot be read.

Furthermore, the unselected memory units $M_{13}, M_{14}, \ldots, M_{1y}$ in the memory unit row R1 will not be read due to the voltage Vs1, for example, about 1.8 V, is applied to WL1; consequently, the select transistor channel of the memory unit $M_{11}$ is closed. Meanwhile, the voltage applied to the bit line BL1 cannot be turned-on to the memory cell. Furthermore, the voltage Vs2, for example, about 0 V, is applied to the control lines CL3, CL4~CLy; thus, the aforementioned memory units cannot be read. Nevertheless, the other unselected memory units $M_{23}, M_{24}, \ldots, M_{xy}$ are all in the standby state and will not be read.

As shown in FIGS. 1A and 2D, when the erasing operation is performed, the voltage Ve1, for example, about 3 V, is applied to the selected word lines WL1 and WL2 in the selected page P1. The voltage Ve2, for example, about −6 V, is applied to the selected control lines CL1~CL2. The selected drain line DL1 is floating. The voltage Ve3, for example, about 6 V, is applied to the N type well region. The voltage Ve4, for example, about 6 V, is applied to all the bit lines BL1~BLx. The voltage difference between the voltage Ve2 and that of Ve4 is sufficient to induce the FN tunneling effect in order to erase all the memory units $M_{11}, M_{21}, \ldots, M_{x1}$ & $M_{12}, M_{22}, \ldots, M_{x2}$ in the selected page P1.

In order to prevent the memory units of $M_{13}, M_{23}, \ldots, M_{xy}$ of other unselected pages P2~Pz from being erased, the voltage Ve5, for example, larger than 0 V or thereabouts, can be applied to the drain lines DL2~DLz in the other unselected pages P2~Pz or be floating so as to control FN tunneling effect.

Moreover, to avoid the memory units $M_{13}, M_{23}, \ldots, M_{xy}$ in the other unselected pages P2~Pz from being erased, the voltage Ve6, for example, about 6 V, should be applied to the word lines WL3, WL4~WLy in the other unselected pages P2~Pz. The voltage Ve7, for example, about −3 V, is applied to the control lines CL3, CL4~CLy in the other unselected pages P2~Pz to control FN tunneling effect. If such bias method is adopted when the erasing operation is preformed to the non-volatile memory, the cross voltage applied is smaller so as to lower the complexity of the coded circuit.

The control lines in the present invention are grouped by two so as to compose a plurality of pages P1~Pz. Therefore, when operating the non-volatile memory array in the present invention, it can prevent the neighboring memory units from programming, erasing and reading disturb mutually. For example, as shown in FIG. 1A, the control line CL1 is electrically connected with the control line CL2; the control line CL3 is electrically connected with the control line CL4; similarly, the control line CL(y−1) is electrically connected with the control line CLy. When the programming operation is preformed to the selected memory unit connected with the control line CL1 and control line CL2 (selected page P1), so long as the bias is applied to the control line CL1 and control line CL2, and the bias that will not cause program disturb is applied to the other unselected control line group (such as control lines CL3~CLy), the program disturb caused to the memory units in other groups can be prevented.

For example, a non-volatile memory array design composed by 128 memory units columns will be firstly considered and designed on the basis of the smallest array area. In order to achieve the smallest area, the control lines (CL~CL128) of the 128 memory units columns will all be electrically connected together; however, in the programming process, the unselected memory units (such as, memory units $M_{35}$) might have 127 times program disturb under the worst situation (programming $M_{31}~M_{3y}$, y=127' except for $M_{35}$); nevertheless, if the control lines of the 128 memory units columns are divided into 64 groups, and there are grouped by two control lines to be electrically connected (such as control lines $M_{35}$ and $M_{36}$ are electrically connected), the program disturb of $M_{35}$ has lowered to once which has remarkably improved the characteristic of the non-volatile memory operation.

Furthermore, when reading operation is preformed to the memory array, only if the bias is applied to the control line CL1 and CL2 (selected page $P_1$) so as to perform with reading to the memory unit connected with the control line CL1 and CL2 (selected page $P_1$) in the selected page and, consequently, the reading operation becomes simpler. Meanwhile, the kind of bias applied becomes simpler as well.

Furthermore, when erasing operation is preformed to the memory array, only if the bias is applied to the control line CL1 and CL2 (selected page $P_1$) and the bias is not applied to the other unselected control line group (such as control lines CL3~CLy), or the bias to control FN tunneling effect is applied to the word lines, control lines or drain lines of the other unselected memory units so as to prevent the phenomenon of soft erasure to the memory unit of other pages.

Although the present invention has been disclosed above by the preferred embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A non-volatile memory, comprising:
    a plurality of memory units arranged in a row/column array, neighboring memory units in the same row being disposed in a mirror symmetry manner, each memory unit comprising:
        a first conductive type well disposed within a substrate;
        a second conductive type drain region, a second conductive type doped region and a second conductive type source region disposed within a first conductive type well;
        a select gate disposed on the substrate between the second conductive type source region and the second conductive type doped region;
        a control gate disposed on the substrate between the second conductive type doped region and the second conductive type drain region; and
        a charge storage structure comprising at least a charge storage layer disposed between the control gate and the substrate;
    the non-volatile memory further comprising:
    a plurality of drain lines arranged in parallel in the column direction and connected with the second conductive type drain regions of the memory units in one column;
    a plurality of bit lines arranged in parallel in the row direction and connected with the second conductive type source region of the memory units in one row;
    a plurality of word lines arranged in parallel in the column direction and connected with the select gate of the memory units in one column; and
    a plurality of control lines arranged in parallel in the column direction and connected with the control gates of the memory units in one column, wherein
    every two control lines are electrically connected together;
    the two columns of memory units with the electrically connected control lines compose a page; and
    the two neighboring memory units in the same page in the row direction commonly share the second conductive type drain region.

2. The non-volatile memory of claim 1, wherein the first conductive type is N type.

3. The non-volatile memory of claim 1, wherein the second conductive type is P type.

4. The non-volatile memory of claim 1, further comprising a gate dielectric layer disposed between the select gate and the substrate.

5. The non-volatile memory of claim 1, further comprising a tunneling dielectric layer disposed between the charge storage layer and the substrate.

6. The non-volatile memory of claim 1, wherein the material of the tunneling dielectric layer comprises silicon oxide.

7. The non-volatile memory of claim 1, wherein the charge storage structure further comprises an inter-gate dielectric layer disposed between the charge storage layer and the control gate.

8. The non-volatile memory of claim 1, wherein the material of the inter-gate dielectric layer comprises silicon oxide.

9. The non-volatile memory of claim 1, wherein the material of the charge storage layer comprises a silicon nitride layer, a silicon oxynitride layer or a nano-crystal layer.

10. The non-volatile memory of claim 1, wherein the material of the charge storage layer comprises doped polysilicon.

11. The non-volatile memory of claim 1, wherein the two neighboring memory units in different pages in the row direction commonly share the second conductive type source region.

12. A method of operating a non-volatile memory, the non-volatile memory comprising:
    a plurality of memory units arranged in a row/column array, neighboring memory units in the same row being disposed in a mirror symmetry manner, each memory unit comprising:
        an N type well region disposed in the substrate;
        a P type drain region, a P type doped region and a P type source region disposed in the N type well region;
        a select gate disposed on the substrate between the P type source region and the P type doped region;
        a control gate disposed on the substrate, between the P type doped region and the P type drain region; and
        a charge storage layer disposed between the control gate and the substrate;
    the non-volatile memory further comprising:
    a plurality of drain lines arranged in parallel in column direction to connect with the P type drain region of each memory unit in one column;
    a plurality of bit lines arranged in parallel in row direction and connected with the P type source region of each memory unit in one row;
    a plurality of word lines arranged in parallel in column direction and connected with the select gate of each memory unit in one column; and
    a plurality of control lines arranged in parallel in column direction and connected with the control gate of each memory unit in one column, wherein every two control lines are electrically connected together, the two columns of memory units with the electrically connected control lines compose a page; and the two neighboring memory units in one page in the row direction commonly share the P type drain region;
    the method comprising:
        applying a first voltage to all of the word lines, applying a second voltage to all of the control lines, floating all of the bit lines, applying a third voltage to all of the drain lines, and applying a fourth voltage to the N type well region so that the non-volatile memory array is in a standby state.

13. The operation method for the non-volatile memory of claim 12, wherein the first voltage is about 1.8 V, the second voltage is about 0 V, the third voltage is about 0 V, and the fourth voltage is about 1.8 V.

14. The operation method for the non-volatile memory of claim 12, further comprising:
when performing a programming operation to the non-volatile memory, applying a fifth voltage to a selected word line connected with a selected memory unit in a selected page, applying a sixth voltage to a selected control line connected with the selected memory unit, applying a seven voltage to a selected bit lines connected with the selected memory unit, applying an eighth voltage to a selected drain line connected with the selected memory unit, and applying the fourth voltage to the N type well region to program the selected memory unit by channel hot hole induced hot electron injection, wherein the fifth voltage is sufficient to open the channel under the select gate of the selected memory unit, the seven voltage is larger than the eighth voltage, the voltage difference between the sixth voltage and seven voltage is sufficient to pull the electron from the P type drain region side of the selected memory unit into the charge storage layer.

15. The method of claim 14, wherein the fifth voltage is about 0 V, the sixth voltage is about 2.5 V, the seventh voltage is about 3 V, and the eighth voltage is about −3 V.

16. The operation method for the non-volatile memory of claim 12, further comprising:
when performing a erasing operation to the non-volatile memory, applying a ninth voltage to a selected word line connected with a selected memory unit in a selected page, applying a tenth voltage to a selected control line connected with the selected memory unit, applying an eleventh voltage to the bit lines, and floating a selected drain line connected with the selected memory unit, and applying a twelfth voltage to the N type well region to erase all memory units in the selected page by FN tunneling effect, wherein the voltage difference between the tenth voltage and eleventh voltage is sufficient to induce the FN tunneling effect.

17. The method of claim 16, wherein the ninth voltage is about 3 V, the tenth voltage is about −6 V, the eleventh voltage is about 6 V, and the twelfth voltage is about 6V.

18. The operation method for the non-volatile memory of claim 16, further comprising:
applying a thirteenth voltage to the drain lines of the memory units in the other unselected page.

19. The operation method for the non-volatile memory of claim 18, wherein the thirteenth voltage is greater than 0 V or floating.

20. The operation method for the non-volatile memory of claim 16, further comprising:
applying a fourteenth voltage to the word lines of the memory units in the other unselected page; and applying a fifteenth voltage to the control lines of the memory units in the other unselected page.

21. The operation method for the non-volatile memory of claim 20, wherein the fourteenth voltage is about 6 V and the fifteenth voltage is about −3 V.

22. The operation method for the non-volatile memory of claim 12, further comprising:
when performing a reading operation to the non-volatile memory, applying a sixteenth voltage to a selected word line connected with a selected memory unit in a selected page, applying the seventeenth voltage to a selected control line connected with the selected memory unit, applying an eighteenth voltage to a selected bit line of the selected memory unit, applying the third voltage to all of the drain lines, applying the fourth voltage to the N type well region to read the selected memory unit, wherein the sixteenth voltage is sufficient to open the channel under the select gate of the selected memory unit, and the eighteenth voltage is larger than that third voltage.

23. The operation method for the non-volatile memory of claim 22, wherein the sixteenth voltage is about −1.5 V, the seventeenth voltage is about 1.8 V, and the eighteenth voltage is about 1.8 V.

* * * * *